July 28, 1964 M. M. KAUFMAN 3,142,769

BIPOLAR PULSE PAIR CIRCUITS EMPLOYING TWO TUNNEL DIODES EACH OPERATING IN A MONOSTABLE MODE

Filed June 8, 1961

INVENTOR.
MELVIN M. KAUFMAN
BY
Carl V. Olson
ATTORNEY

United States Patent Office 3,142,769
Patented July 28, 1964

3,142,769

BIPOLAR PULSE PAIR CIRCUITS EMPLOYING TWO TUNNEL DIODES EACH OPERATING IN A MONOSTABLE MODE

Melvin M. Kaufman, Merchantville, N.J., assignor to Radio Corporation of America, a corporation of Delaware Filed June 8, 1961, Ser. No. 115,797
11 Claims. (Cl. 307—88.5)

This invention relates to bipolar pulse pair circuits, and particularly to bipolar pulse pair generators employing active elements in the form of negative resistance devices such as tunnel diodes, and including a circuit for translating an input pulse of one polarity to a delayed output pulse of opposite polarity.

A bipolar pulse pair generator is useful, for example, in the random access memory of an electronic computer. In such applications, it is often desired to supply a pulse of one polarity to the memory elements for reading out from the memory, and immediately thereafter to supply a pulse of the opposite polarity for writing into the memory.

It is an object of this invention to provide an improved and simplified bipolar pulse pair generator.

It is another object to provide an improved system for supplying bipolar pulse pairs to a plurality of memory elements.

It is yet another object to provide a monostable tunnel diode circuit which translates an input pulse of one polarity to a delayed output pulse of opposite polarity.

It is a further object to provide a pulse pair generator capable of generating bipolar pulses of very short duration.

According to the invention, two oppositely-poled monostable tunnel diode circuits have their outputs coupled to a common load or utilization means, such as a number of memory elements in a word storage location. An input trigger pulse may be applied to one of the tunnel diode circuits to cause it to go through a reactive monostable cycle during which a pulse of one polarity is coupled to the common load. The termination of the pulse of one polarity then causes the other monostable tunnel diode circuit to go through a reactive monostable cycle during which a pulse of opposite polarity is coupled to the common load.

These and other objects and aspects of the invention will be apparent to those skilled in the art from the following more detailed description taken in conjunction with the appended drawings, wherein.

Figure 1:
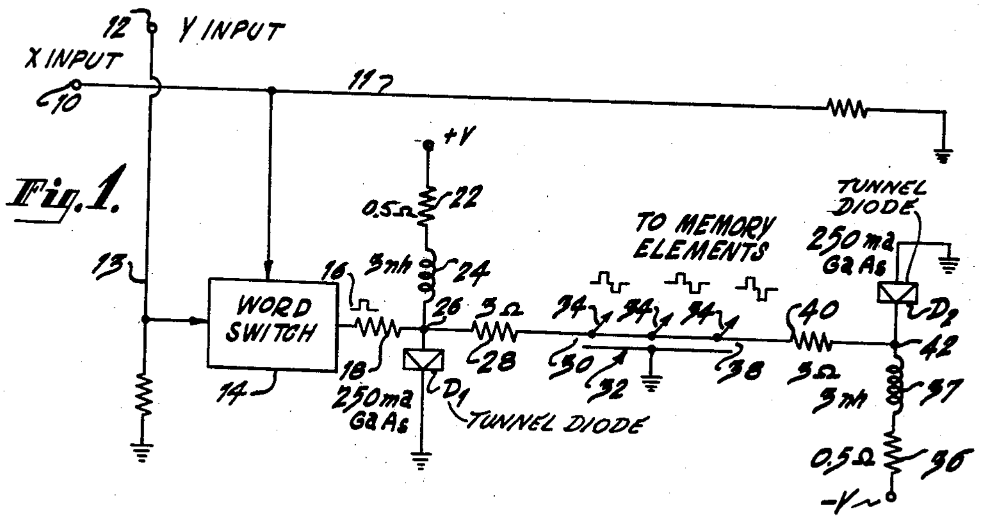
FIGURE 1 is a circuit diagram of a bipolar pulse pair generator, including two tunnel diode monostable circuits, shown in a random access memory environment.

FIGURE 1 shows a small portion of a random access memory wherein a word location of the memory is selected by simultaneously applying an X selection pulse to terminal 10 and bus 11 and a Y selection pulse to terminal 12 and bus 13. The selection pulses energize a word switch 14 which generates an output trigger pulse 16 which is applied through an isolating resistor 18 to the junction point 26 of a bipolar pulse generator circuit including tunnel diodes $D_1$ and $D_2$. The bipolar pulse generator, to be described in detail, supplies an output to the memory elements of a word storage location corresponding with the coordinate selection terminals 10 and 12. The memory of which a part is shown in FIGURE 1 has a large number of X selection buses ike bus 11, a large number of Y selection buses like bus 13, and a word switch, a bipolar pulse generator and a word storage location associated with each intersection of an X selection bus and a Y selection bus.

A first monostable tunnel diode circuit includes a resistor 22, an inductor 24 and a tunnel diode $D_1$ connected in series between the +V and ground terminals of a source of bias potential. The output pulse 16 from the word switch 14 is applied to the junction point 26 so that it appears across the tunnel diode $D_1$. The junction point 26 is coupled through an isolating resistor 28 to one end 30 of a transmisison line 32. The transmission line 32 has a number of taps 34 along its length which are coupled to individual tunnel diode memory elements (not shown) used to store the bits of one word in the memory.

A second monostable tunnel diode circuit includes a resistor 36, an inductor 37 and a tunnel diode $D_2$ connected in series between the −V and ground terminals of a source of bias potential. The end 38 of the transmission line 32 is coupled through an isolating resistor 40 to the junction point 42 between the inductor 37 and the diode $D_2$. The monostable circuits including diodes $D_1$ and $D_2$ are oppositely poled, and the anode of diode $D_1$ is coupled to the one end 30 of the transmission line 32, and the cathode of diode $D_2$ is coupled to the other end 38 of the transmission line 32.

Figure 3:
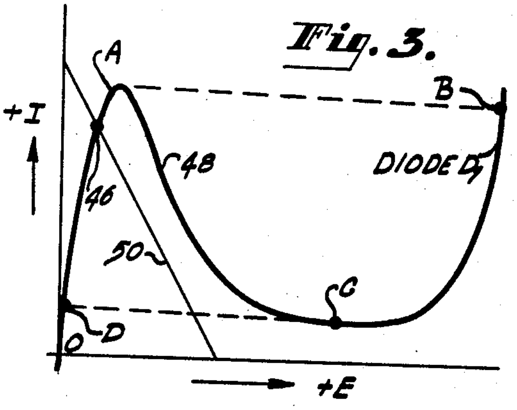
FIGURE 3 is a current vs. voltage characteristic chart which will be referred to in describing the operation of the monostable circuit including diode $D_1$ in FIGURE 1.
Figure 4:
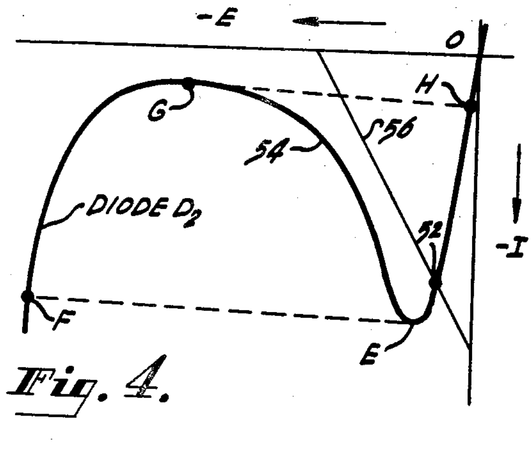
FIGURE 4 is a current vs. voltage characteristic chart which will be referred to in describing the operation of the oppositely-poled monostable circuit including diode $D_2$ in FIGURE 1.

The values of the circuit elements and bias voltage associated with the diode $D_1$ are selected to provide monostable operation, as illustrated by the current-voltage chart of FIGURE 3, wherein the quiescent operating point 46 is determined by the intersection of the curve 48 of the diode $D_1$ and a monostable load line 50. The circuit of diode $D_2$ is similar but with reversed polarity, as illustrated in FIGURE 4, wherein the quiescent operating point 52 is determined by the intersection of the characteristic 54 of the diode $D_2$ with the monostable load line 56.

Figure 2:
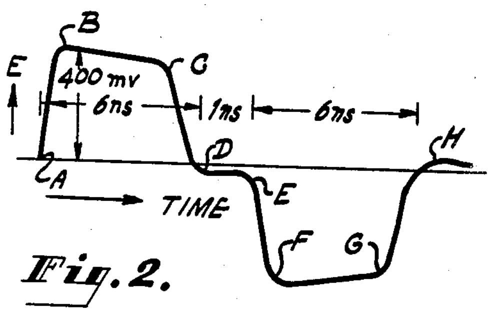
FIGURE 2 is a voltage waveform illustrative of the output of the bipolar pulse generator in FIGURE 1.

In the operation of the system of FIGURE 1, the coincident application of X selection and Y selection pulses to the terminals 10 and 12 causes the word switch 14 to generate a positive trigger pulse 16 which is applied to the junction point 26 of the monostable tunnel diode circuit including diode $D_1$. When the tunnel diode monostable circuit including the diode $D_1$ is triggered, it goes through a reactive monostable cycle which generates an output pulse having a duration determined primarily by the values of the inductor 24. The operating point starts from the quiescent point 46 (FIGURE 3), moves up over the peak A of the diode characteristic curve 48, switches rapidly to a point such as B in the high voltage region of the characteristic curve, moves down along the curve to the point C in the valley thereof, switches rapidly to a point such as the point D, and then more slowly returns to the initial quiescent operating point 46. The points A, B, C and D on the output voltage waveform chart of FIGURE 2 correspond respectively with the points A, B, C and D in the characteristic chart of FIGURE 3.

The reactive monostable cycle of the circuit of diode $D_1$ results in the generation of a positive output pulse which is coupled to the end 30 of the transmission line 32. This output pulse is coupled from taps 34 on the line to the memory elements of the corresponding word. The positive pulses applied to the memory elements (not shown) cause information to be read out from the word location. It is then desired to apply negative polarity pulses to the memory elements to cooperate with other pulses to write information back into the memory word location.

The positive pulse generated by the tunnel diode $D_1$ and applied to the transmission line 32 is also coupled through the transmission line, after a very short delay, to the tunnel diode $D_2$. The transmission line 32 may cause a delay of only about one-half of a nanosecond, and this delay is negligible compared with the duration of the pulse, which may be several nanoseconds. The positive pulse does not trigger the diode $D_2$ because the polarity of the positive pulse applied to the cathode of the diode $D_2$ is such as to reduce the bias current already flowing in the diode $D_2$. The result is that the quiescent operating point 52 (FIGURE 4) of the diode $D_2$ moves up along the characteristic curve in a direction toward the origin O. At the same time, the positive pulse applied to the junction point 42 results in an increased current flow through the inductor 37 toward the −V terminal, compared with the current under quiescent conditions.

After the termination at time C of the positive pulse on the transmission line 32 and on the diode $D_2$, the current which was previously flowing through inductor 37 tends to continue flowing because of the inherent characteristics of an inductor. Since this current is no longer supplied by the positive pulse through the resistor 40, the current must be drawn from ground through the diode $D_2$. This increased current drawn in the forward direction through the diode $D_2$ causes its operating point to move from the quiescent point 52 (FIGURE 4) over the current peak at E and switch rapidly to a point such as F. Thereafter, the reactive monostable cycle continues through the operating points G, H and back to 52.

The negative pulse thus generated by the circuit of tunnel diode $D_2$ is applied to the end 38 of the transmission line 32, and thence from the taps 34 to the memory elements to permit the writing of information into the word location. It is thus seen that the bipolar pulse generator acts in response to a positive trigger pulse 16 to generate a bipolar pulse pair which is coupled to the memory elements of the corresponding word location.

After the termination at time G of the negative pulse supplied by diode $D_2$ to the transmission line 32, the voltage transition also coupled to the diode $D_1$ does not cause the diode $D_1$ to again go through its reactive monostable cycle. Diode $D_1$ is not re-triggered because at the time of the trailing edge G–H of the negative pulse from diode $D_2$, the diode $D_1$ has not completely recovered from its monostable cycle of operation. That is, the operating point of diode $D_1$ has not had time to return from point D (FIGURE 3) to the quiescent point 46. The current necessary to move the operating point from near D up to the quiescent operating point 46 and then up over the current peak A is greater than can be supplied by the energy stored in the inductor 24. Thus, diode $D_2$ is triggered by the trailing edge of the positive pulse from diode $D_1$ because diode $D_2$ is triggered from the quiescent point 52, but diode $D_1$ is not re-triggered by the trailing edge of the negative pulse from diode $D_2$ because diode $D_1$ has not had time to return to its quiescent operating point 46. The described mode of operation obtains so long as the duration of the negative pulse from diode $D_2$ (determined primarily by inductor 37) is shorter than the recovery time (D to 46) of the circuit of diode $D_1$.

While the bipolar pulse pair generator has been illustrated and described as supplying a pulse pair to the ends of a transmission line 32, it will be understood that the outputs of the circuits of tunnel diode $D_1$ and $D_2$ may be coupled to a single terminal, rather than to the ends of a transmission line. In this case, the single terminal is coupled to the desired utilization means. The use in a memory application of a transmission line 32 between the two monostable circuits is advantageous because it simplifies the problem of terminating the ends of the line. However, the use of the transmission line is not essential to the operation of the bipolar pulse pair generator. It will also be understood that the polarities of the pulses and circuit can be reversed if desired.

It will be noted that the circuit of tunnel diode $D_2$ in FIGURE 1 is a monostable circuit which translates a positive input pulse supplied thereto to a delayed negative polarity output pulse. The circuit of diode $D_2$ is thus a circuit useful in applications other than in the bipolar pulse pair generator illustrated in FIGURE 1.

Figure 5:
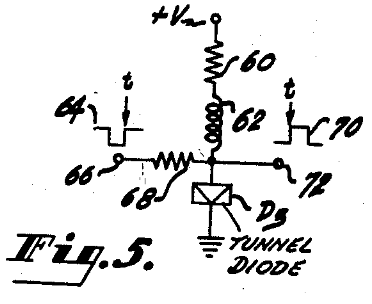
FIGURE 5 is a circuit diagram of a monostable circuit which translates a negative input pulse to a delayed positive output pulse.

FIGURE 5 shows a monostable tunnel diode circuit for translating a negative input pulse to a delayed positive polarity output pulse. The circuit of FIGURE 5 shows a circuit including the series combination of a +V bias voltage source terminal, a resistor 60, an inductor 62 and a tunnel diode $D_3$. A negative input pulse 64 applied to input terminal 66 is coupled through resistor 68 to the tunnel diode $D_3$. A delayed positive output pulse 70 is provided at an output terminal 72. The trailing edge of the input pulse 64 at time $t$ corresponds approximately with the leading edge at time $t$ of the output pulse 70. It will be observed that the circuit of FIGURE 5 is similar to the circuit of tunnel diode $D_2$ in FIGURE 1 except that the polarities of the bias source, the diode $D_3$ and the input and output pulses are reversed. Both circuits are monostable circuits which translate an input pulse of one polarity to an output pulse of the opposite polarity.

The operation of the circuit of FIGURE 5 is similar to the already-described operation of the circuit of tunnel diode $D_2$ in FIGURE 1. Briefly, the tunnel diode $D_3$ is quiescently biased in the low-voltage positive-resistance region of its characteristic. The negative input pulse applied to the tunnel diode reduces the bias current flowing through the diode and increases the current flowing from the +V terminal through the inductor 62. At the termination of the input pulse 64 at time $t$, the increased current flowing through the inductor 62 tends to continue flowing because of the energy storage property of an inductor, and this current flows through the tunnel diode $D_3$ causing it to switch to its high voltage state. The circuit then continues through its monostable cycle which generates the delayed positive output pulse 70 at the output terminal 72. In the design of the circuit of FIGURE 5, it is necessary that the duration of the input pulse be great enough with relation to the value of the inductor 62 so that the increased current built up in the inductor 62 is sufficiently large to cause triggering of the tunnel diode $D_3$ at the termination of the input pulse.

It is thus apparent that according to this invention there is provided a relatively simple, effective and reliable means for generating a pair of very short duration bipolar pulses for application to a utilization means, and also a monostable circuit for translating an input pulse of one polarity to a delayed output pulse of opposite polarity.

What is claimed is:

1. A bipolar pulse pair generator comprising two monostable circuits having respective oppositely-poled tunnel diodes, means for coupling both of said circuits to a utilization means, and means to apply an input trigger pulse to one of said circuits to cause it to go through a reactive monostable cycle supplying a pulse of one polarity to said utilization means, whereupon the termination of said pulse results in the triggering of said other circuit through a reactive monostable cycle supplying a pulse of opposite polarity to said utilization means.

2. A bipolar pulse pair generator comprising two monostable circuits having respective oppositely-poled tunnel diodes, means coupling both of said circuits to a utilization means, and means to apply an input trigger pulse to one of said circuits, whereby said one circuit goes through a reactive monostable cycle supplying a pulse of one polarity to said utilization means and to said other circuit, whereupon said other circuit is caused to go through a reactive monostable cycle supplying a pulse of opposite polarity to said utilization means.

3. A bipolar pulse pair generator comprising two monostable circuits having respective oppositely-poled negative resistance diodes, means for coupling both of said circuits to a utilization means, means to bias said negative resistance diodes in the low voltage regions of their characteristic curves, and means to apply an input trigger pulse to one of said circuits, whereby said one circuit goes through a reactive monostable cycle supplying a pulse of one polarity to said utilization means and to said other circuit, whereupon said other circuit is caused to go through a reactive monostable cycle supplying a pulse of opposite polarity to said utilization means.

4. A bipolar pulse pair generator comprising two monostable negative resistance diode circuits, means coupling the anode of one diode and the cathode at the other diode to a utilization means, and means to apply an input trigger pulse to one of said circuits to cause said one circuit to go through a reactive monostable cycle supplying a pulse of one polarity to said utilization means and to said other circuit, whereupon said other circuit is caused to go through a reactive monostable cycle supplying a pulse of opposite polarity to said utilization means.

5. A bipolar pulse pair generator comprising two monostable circuits having respective oppositely-poled tunnel diodes, a transmission line coupled at one end to one of said circuits and coupled at the other end to the other of said circuits, and means to apply an input trigger pulse to one of said circuits to cause said one circuit to go through a reactive monostable cycle supplying a pulse of one polarity to said transmission line, whereupon the termination of said pulse at the other end of the line causes said other circuit to go through a reactive monostable cycle supplying a pulse of opposite polarity to said transmission line.

6. A bipolar pulse pair generator comprising first and second monostable tunnel diode circuits, a transmission line, means coupling the anode of one tunnel diode to one point on said transmission line, means coupling the cathode of the other tunnel diode to another point on said transmission line, means to bias said tunnel diodes in one of their positive resistance regions, and means to apply a trigger pulse to one of said tunnel diode circuits to cause it to go through a reactive monostable cycle and deliver a pulse of one polarity to said transmission line, whereby the termination of said pulse at said other point triggers the other of said tunnel diode circuits causing it to go through its reactive monostable cycle and deliver a pulse of opposite polarity to said transmission line.

7. A bipolar pulse pair generator comprising first and second monostable tunnel diode circuits, a transmission line having taps for memory element utilization means, means coupling the anode of one tunnel diode to one end of said transmission line, means coupling the cathode of the other tunnel diode to the other end of said transmission line, means to bias said tunnel diodes so they are in their low voltage states, and means to apply a trigger pulse to one of said tunnel diode circuits to cause it to go through a reactive monostable cycle and deliver a pulse of one polarity to said transmission line, whereby the termination of said pulse at said other end triggers the other of said tunnel diode circuits causing it to go through its reactive monostable cycle and deliver a pulse of opposite polarity to said transmission line.

8. A bipolar pulse pair generator comprising first and second monostable tunnel diode circuits each including a resistor, an inductor and a tunnel diode connected in series between bias potential terminals, a transmission line having taps for memory element utilization means, means coupling the anode of one tunnel diode to one end of said transmission line, means coupling the cathode of the other tunnel diode to the other end of said transmission line, means to bias said tunnel diodes so they are in their low voltage states, and means to apply a trigger pulse to one of said tunnel diode circuits to cause it to go through a reactive monostable cycle and deliver a pulse of one polarity to one end of said transmission line, whereby the termination of said pulse at the other end triggers the other of said tunnel diode circuits causing it to go through its reactive monostable cycle and deliver a pulse of opposite polarity to the opposite end of said transmission line.

9. Means to translate a pulse of one polarity to a delayed pulse of opposite polarity comprising a monostable circuit including an inductor and a negative resistance diode connected in series, means to apply a bias current through said inductor to said diode to bias the diode at a point on the low-voltage positive-resistance region of its characteristic, means to apply an input pulse to the junction between said inductor and said diode in a polarity to reduce the bias current therein and to increase the current flowing through said inductor, whereby at the termination of said input pulse the increased current flowing through said inductor is directed through said diode in a direction causing said diode to switch to its high voltage state and go through a monostable cycle of operation, and means to derive a resulting opposite polarity output pulse from said diode.

10. Means to translate a pulse of one polarity to a delayed pulse of opposite polarity comprising a monostable circuit including an inductor and a tunnel diode connected in series, means to apply a bias current through said inductor to said tunnel diode to bias the tunnel diode at a point on the low-voltage positive-resistance region of its characteristic, means to apply an input pulse to the junction between said inductor and said diode in a polarity to reduce the bias current therein and to increase the current flowing through said inductor, whereby at the termination of said input pulse the increased current flowing through said inductor is directed through said tunnel diode in a direction causing said diode to switch to its high voltage state and go through a monostable cycle of operation, and means to derive a resulting opposite polarity output pulse from said tunnel diode, said inductor having a value selected with relation to the duration of the input pulse to store sufficient energy to cause switching of the tunnel diode at the termination of the input pulse.

11. Means to translate a pulse of one polarity to a delayed pulse of opposite polarity comprising a monostable circuit including an inductor and a tunnel diode connected in series, means to apply a bias current through said inductor to said tunnel diode to quiescently bias the tunnel diode at a stable point in a positive-resistance region of its characteristic, means to apply an input pulse to the junction between said inductor and said diode in a polarity to change the bias current therein and to change the current flowing through said inductor, whereby at the termination of said input pulse the changed current flowing through said inductor is directed through said tunnel diode in a direction causing said diode to switch to its other positive-resistance region and go through a monostable cycle of operation, and means to derive a resulting opposite polarity output pulse from said tunnel diode.

References Cited in the file of this patent

UNITED STATES PATENTS 2,975,377 Price et al. ............ Mar. 14, 1961

OTHER REFERENCES

"Esaki Diode Binary Counter," IBM Technical Disclosure Bulletin, vol. 3, No. 9, February 1961, page 34.